(12) United States Patent
Pan et al.

(10) Patent No.: US 10,983,186 B2
(45) Date of Patent: Apr. 20, 2021

(54) SUPPORTING STRUCTURE FOR A GRADIENT COIL ASSEMBLY OF A MRI

(71) Applicant: KONINKLIJKE PHILIPS N.V., Eindhoven (NL)

(72) Inventors: Jun Pan, Shanghai (CN); Jian Lin, Suzhou (CN); Xianrui Huang, Clifton Park, NY (US); Cornelis Leonardus Gerardus Ham, Oirschot (NL); Yan Zhao, Shanghai (CN); Yun Zhou, Suzhou (CN)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/468,320

(22) PCT Filed: Dec. 13, 2017

(86) PCT No.: PCT/EP2017/082669
§ 371 (c)(1),
(2) Date: Jun. 11, 2019

(87) PCT Pub. No.: WO2018/109028
PCT Pub. Date: Jun. 21, 2018

(65) Prior Publication Data
US 2020/0072924 A1 Mar. 5, 2020

(30) Foreign Application Priority Data

Dec. 14, 2016 (WO) ................ PCT/CN2016/109837
Jan. 20, 2017 (EP) ..................................... 17152328

(51) Int. Cl.
*G01R 33/385* (2006.01)
*G01R 33/3873* (2006.01)
*G01R 33/421* (2006.01)

(52) U.S. Cl.
CPC ..... *G01R 33/3858* (2013.01); *G01R 33/3873* (2013.01); *G01R 33/4215* (2013.01)

(58) Field of Classification Search
CPC ............ G01R 33/3858; G01R 33/3873; G01R 33/4215
See application file for complete search history.

(56) References Cited

U.S. PATENT DOCUMENTS

| 6,160,399 A | 12/2000 | Radziun et al. |
| 8,203,341 B2 * | 6/2012 | Teklemariam ....... G01R 33/385 324/318 |
| 2003/0218460 A1 | 11/2003 | Heid |

(Continued)

FOREIGN PATENT DOCUMENTS

| JP | 2014180446 A | 9/2014 |
| JP | 5738715 B2 | 6/2015 |

*Primary Examiner* — Susan S Lee

(57) ABSTRACT

A gradient coil assembly (62) for use in a Magnetic Resonance Imaging (MRI) system includes primary coils (68), shield coils (72) and a supporting structure (10) arranged between the primary coils (68) and the shield coils (72). The supporting structure (10) includes at least a supporting element (12) including a first end face (14) and at least a first recess (24) with an opening (26) in the first end face (14). The first recess (24) extends in a longitudinal direction (18) of the supporting element (12) forming a tray for receiving a passive shim bar.

17 Claims, 6 Drawing Sheets

(56) References Cited

U.S. PATENT DOCUMENTS

| | | | |
|---|---|---|---|
| 2008/0169813 A1* | 7/2008 | Yamashita | G01R 33/4215 324/321 |
| 2008/0191698 A1* | 8/2008 | Nogami | G01R 33/3854 324/318 |
| 2010/0148779 A1 | 6/2010 | Yin et al. | |
| 2011/0074419 A1* | 3/2011 | Sakakura | G01R 33/421 324/318 |
| 2012/0119741 A1 | 5/2012 | Kimmlingen et al. | |
| 2012/0317795 A1* | 12/2012 | Fath | G01R 33/3858 29/605 |
| 2015/0008923 A1* | 1/2015 | Ando | G01R 33/3873 324/309 |
| 2015/0346294 A1 | 12/2015 | Nogami et al. | |
| 2016/0202333 A1* | 7/2016 | Peng | G01R 33/3858 324/322 |

* cited by examiner

SUPPORTING STRUCTURE FOR A GRADIENT COIL ASSEMBLY OF A MRI

CROSS REFERENCE TO RELATED APPLICATIONS

This application is a U.S. national phase application of International Application No. PCT/EP2017/082669 filed on Dec. 13, 2017, which claims the benefit of PCT/CN2016/109837 filed Dec. 14, 2016 and EP Application Serial No. 17152328.5 filed on Jan. 20, 2017 and is incorporated herein by reference.

FIELD OF THE INVENTION

The invention relates to a supporting structure for arranging between primary coils and shield coils of a gradient coil assembly of a Magnetic Resonance Imaging (MRI) system, a gradient coil assembly for use in a MRI system comprising a supporting structure, a Magnetic Resonance Imaging (MRI) system comprising a gradient coil assembly with a supporting structure, and a method for manufacturing a gradient coil assembly.

BACKGROUND OF THE INVENTION

Magnetic Resonance Imaging (MRI) is a medical imaging technique used in radiology to image the anatomy and the physiological processes of a subject of interest. MRI uses a magnet to create a strong, uniform, static magnetic field (i.e., the "main magnetic field") and a gradient coil assembly comprising x-, y- and z-gradient coils, respectively primary coils, to produce smaller amplitude, spatially varying magnetic fields when a current is applied to the respective coils. A gradient coil assembly further comprises an active shielding to prevent eddy currents. The active shielding comprises three corresponding active shield coils arranged beyond the x-, y- and z-gradient coils. The active shield coils have a topology in parallel with their associated x-, y- and z-gradient coils for imaging but at larger radii. Passive shiming elements, for achieving a uniform magnetic main field, are arranged between the gradient coils and the shield coils.

The known gradient coil assembly is usually manufactured in three main steps, wherein in a first main step an inner cylindrical mold comprising x-, y- and z-gradient coils is manufactured. In a second main step, an outer cylindrical mold having a larger radii than the inner cylindrical mold comprising active shield coils is molded. In a third main step the outer cylindrical mold is imposed on the inner cylindrical mold. Passive shim bar tools for providing a tray for a passive shim bar are arranged in the annulus between inner cylindrical mold and the outer cylindrical mold. Finally the annulus between the inner cylindrical mold and the outer clindrical mold is casted. However, since the annulus between the inner cylindrical mold and the outer cylindrical mold is limited, the arrangement and alignment of the passive shim bar tools for generating trays for the respective passive shim bars is difficult. Thus, manufacturing a gradient coil assembly is complicated and therefore time and cost ineffective.

A gradient coil system having at least one shim receptable space for passive shim elements between gradient coils and shielding coils is known from US 2003/0218460 A1.

JP 5738715 B2 describes a magnetic resonace imaging apparatus having a reduced thickness of a magnetic field gradient coil, while suppressing vibrations of the magnetic field gradient coil. The magnetic resonance imaging apparatus comprises magnetic field gradient coils comprising a mold part including a cylindrical inner side mold part which integrally molds main coils, and a cylindrical upper side mold part which is provided on a radial direction upper side of the inner side mold part and integrally molds shield coils. Both ends in the axial direction of the upper side mold part are projected axially toward the outside of the inner side mold part. Reinforcement ribs are attached at an interval from each other in a circumferential direction on the inner peripheral surfaces of both ends in the axial direction of the upper side mold part.

US2016/0202333A1 discloses a gradient coil for a magnetic resonance imaging system has a primary coil set in a cylindrical shape, a secondary coil set cylindrically sheathed on an outer periphery of the primary coil set, and one or more support structures located on the outer periphery of the primary coil set to support the secondary coil set in a radial direction of the gradient coil.

However, there is always a need to optimize the manufacturing process of a gradient coil assembly to reduce manufacturing time and costs.

SUMMARY OF THE INVENTION

It is desirable to reduce manufacturing time and costs of a gradient coil assembly, to simplify the manufacturing process of a gradient coil assembly and to reduce costs of a MRI system.

It is therefore an object of the present invention to provide a supporting structure for arranging between primary coils and shield coils of a gradient coil assembly to simplify the positioning and/or the alignment of passive shim bars in the gradient coil assembly. It is a further object to reduce manufacturing time and costs of a gradient coil assembly as well as to provide a method for manufacturing a gradient coil assembly, having a reduced manufacturing time and costs.

In one aspect, the object is achieved by a supporting structure for arranging between primary coils and shield coils of a gradient coil assembly, comprising
  a supporting element, comprising a first end face and
  at least a first recess with an opening in the first end face, wherein the first recess extends in a longitudinal direction of the supporting element forming a tray for receiving a passive shim bar.

It is an aspect of the invention that the supporting structure comprises a supporting element, wherein the supporting element comprises a first end face. A first recess, comprising an opening in the first end face, extends in a longitudinal direction of the supporting element, wherein the recess forms a tray for receiving a passive shim bar. Preferably, the first recess and/or the opening have a rectangular shape in a cross section perpendicular to the longitudinal direction of the supporting element. Thus, the supporting structure comprises a recess extending in longitudinal direction of the supporting structure, wherein a passive shim bar can be easily inserted through the opening in the first end face to the first recess. Hence, the alignment of the passive shim bar is defined by the run of first recess in the supporting element. The supporting element, defining the run of the first recess, can be easily arranged and aligned on the primary coils. Thus, a supporting structure is provided, allowing a simplified alignment of a supporting element on the primary coils of a gradient coil assembly, and allowing to comfortably and precisely arrange passive shim bars in the gradient coil assembly. Due to the simplified alignment of the supporting structure and the alignment of the tray for the passive shim bar, manufacturing time of the gradient coil assembly and costs can be reduced.

In a preferred embodiment of the invention, the supporting element comprises an inner side and an outer side each being arranged in a direction parallel to the longitudinal direction of the supporting element, and the outer side is arranged spaced apart to the inner side, wherein the first recess is arranged on the inner side or the first recess is arranged between the inner side and the outer side. Thus, the first recess forming a tray is either located as a groove like structure on the inner side of the supporting element or as a framed recess between the inner side and the outer side. The arrangement of the first recess on the inner side can simplify the manufacturing process of the supporting element. Furthermore, the structural height of the supporting element in a direction perpendicular to the longitudinal direction of the supporting element can be reduced. However, the arrangement of the first recess as a framed recess between the inner side and the outer side can optimize the guiding for the passive shim bar.

In a preferred embodiment of the invention, the outer side comprises a plurality of first grooves. Thus, a cooling channel and/or a z-wire of a shield coil can be easily positioned and guided in the first grooves of the supporting element.

In a preferred embodiment of the invention, the longitudinal direction of each first groove is arranged in an angle between 80° and 90° with respect to the longitudinal direction of the supporting element. Preferably, the first grooves are arranged at 90° with respect to the longitudinal direction of the supporting element, which is a direction perpendicular to the longitudinal direction of the supporting element. Preferably, the first grooves are arranged at least partially side by side to each other. Thus, a cooling channel and/or a z-wire of a shielding coil can be easily positioned and guided in the first grooves of the supporting element.

In a preferred embodiment of the invention, the supporting element further comprises a distance setting element positionable at least partially on the outer side of the supporting element, wherein the distance setting element comprises an outer surface, facing in the same direction as the outer side of the supporting element, and the outer surface comprises a plurality of second grooves. Hence, a cooling channel and/or a z-wire of a shield coil can be inserted and guided in the second grooves. Thus, the amount of grooves for guiding the cooling channel and/or the z-wire of a shield coil can be increased. Preferably, the supporting structure comprises first grooves on its outer side for either guiding the cooling channel and/or the z-wire of the shield coil. The distance setting element is arranged on the outer side of the supporting element, wherein the other one of the cooling channel or the z-wire, which is guided in the first grooves, is guided in the second grooves of the distance setting element.

In a preferred embodiment of the invention, the outer side of the supporting element comprises a second recess in longitudinal direction of the supporting element, and the distance setting element is positionable in the second recess. Thus, the position of the distance setting element can be secured since the distance setting element is guided in the second recess of the supporting element.

In a preferred embodiment of the invention, the longitudinal direction of the second grooves is arranged in an angle between 80° and 90° with respect to the longitudinal direction of the supporting element. Preferably, the second grooves are arranged at 90° with respect to the longitudinal direction of the supporting element, which is a direction perpendicular to the longitudinal axis of the supporting element. Hence, the cooling channel and/or the z-wire of a shield coil can be easily guided in the second grooves.

In a preferred embodiment of the invention, a structural depth of the first grooves in a direction perpendicular to the longitudinal direction of the supporting element is larger than a structural depth of the second recess in a direction perpendicular to the longitudinal direction of the supporting element. Thus, a cooling channel or a z-wire of a shield coil can be inserted and guided in the first grooves, the distance setting element is positioned in the second recess on the outer side of the supporting element, and the other one of the cooling channel or the z-wire, which is guided in the first grooves, can be inserted and guided in the second grooves of the distance setting element.

Preferably, the first grooves and the second grooves are arranged equidistantly to each other. More preferably, the first grooves and the second groves are arranged with an offset in relation to each other.

In a preferred embodiment of the invention, the supporting element further comprises a first side connecting the inner side and the outer side, and a second side connecting the inner side and the outer side, wherein the first side is arranged spaced apart to the second side.

In a preferred embodiment of the invention, the supporting element comprises a ring segment shape in a plane perpendicular to the longitudinal direction of the supporting element. Hence, the inner side is formed as a first circular arc in a plane perpendicular to the longitudinal direction of the supporting element and the outer side is formed as a second circular arc, wherein the radii of the second circular arc is larger than the one of the first circular arc. The first side and the second side are directed in radial direction. Thus, a plurality of supporting element can be easily arranged in a cylindrical shape.

In a preferred embodiment of the invention, a third groove, extending in longitudinal direction of the supporting element, is formed in a corner area of the outer side and the first side and/or in a corner area of the outer side and the second side. Thus, the supporting element comprises a guiding structure in longitudinal direction of the supporting element for a cooling channel which is arranged in the respective longitudinal direction.

In a preferred embodiment of the invention, the supporting structure comprises at least a channel extending in longitudinal direction of the supporting element. Preferably, the channel comprises a first channel opening in the first end face and/or a second channel opening in a second end face, wherein the second end face is arranged spaced apart to the first end face in longitudinal direction of the supporting element. Thus, a cooling channel can be guided through the channel. More preferably, a cooling unit can be connected to the first channel opening and/or the second channel opening, wherein a cooling medium can be guided through the channel. Thus, a supporting structure is provided which allows a comfortable connection of a cooling unit, respectively a comfortable arrangement of a cooling channel.

In a preferred embodiment of the invention, the supporting structure comprises a plurality of supporting elements. Preferably, the plurality of supporting elements is arranged in peripheral direction around primary coils of a gradient coil assembly. Thus, a supporting structure is provided comprising a plurality of first recesses for inserting passive shim bars, wherein the supporting elements can be comfortably and easily arranged and aligned on the primary coils, optimizing the manufacturing process of a gradient coil assembly.

In a preferred embodiment of the invention, the plurality of supporting elements is formed to a cylinder, wherein the first side of a first supporting element is connected to the second side of a second supporting element.

In a preferred embodiment of the invention, the first side comprises a first interlocking structure, and the second side comprises a second interlocking structure, wherein the first interlocking structure corresponds to the second interlocking structure. Thus, the supporting elements can be connected to each other. Hence, the structural strength of the supporting structure comprising a plurality of supporting elements can be increased. Furthermore, vibrations of the gradient coil assembly during operation can be reduced. The first interlocking structure and the corresponding second interlocking structure is not limited to a specific design. Preferably, the first interlocking structure and the second interlocking structure is a tongue and groove connection, wherein the tongue is formed at least partially on the first side of supporting element and the groove is formed at least partially on the second side of the supporting element. More preferably, the first interlocking structure is a protrusion formed on the first side of the supporting element and the second interlocking structure is an interlocking recess formed on the second side of the supporting element, wherein the protrusion of a first supporting element is configured to interlock in the interlocking recess of a second supporting element.

The supporting structure can comprise epoxy material, preferably filled with glass balls. The E-modulus of epoxy lies between 2 to 5 GPa. Epoxy filled with glass balls has an E-modulus in the order of 5 to 12 GPa. According to a preferred embodiment of the invention, the supporting structure comprises concrete and/or glass and/or ceramics, preferably Alumina ($Al_2O_3$). Thus, a supporting structure can be provided comprising a high E-modulus to minimize the vibration amplitude of the gradient coils and the acoustic noise level during operation of the gradient coil assembly. High strength concrete comprises an E-modulus in the order of 30 GPa. The property of concrete can be tuned to the desired strength and the required damping. Glass comprises an E-modulus in the order of 65 to 70 GPa. Furthermore, glass can be casted. Thus, the supporting structure can be casted and/or produced by extrusion. Ceramics, preferably Alumina ($Al_2O_3$), have an E-modulus in the order of 390 GPa. The supporting structure comprising $Al_2O_3$ can be manufactured by extrusion.

In a preferred embodiment of the invention, a viscoelastic material is arranged between the first side of the first supporting element and the second side of the second supporting element. Thus, high resonance peaks as a function of the frequency during operation of the gradient coil assembly can be reduced.

The invention further concerns to a gradient coil assembly for use in a Magnetic Resonance Imaging (MRI) system, comprising
  primary coils,
  shield coils and
  a supporting structure being arranged between the primary coils and the shield coils, wherein the supporting structure comprises at least a supporting element comprising a first end face and at least a first recess with an opening in the first end face, wherein the first recess extends in a longitudinal direction of the supporting element forming a tray for receiving a passive shim bar.

The primary coils preferably comprises x-, y- and z gradient coils. The shield coils comprises x-, y- and z shield coils. The supporting structure is arranged between the gradient coils and the shield coils. Usually the supporting structure comprises a plurality of supporting elements, wherein each supporting element comprises a first end face. A first recess, comprising an opening in the first end face, extends in longitudinal direction of the supporting element, wherein the recess forms a tray for receiving a passive shim bar. Preferably, the first recess and/or the opening have a rectangular shape in a cross section perpendicular to the longitudinal direction of the supporting element. Thus, the supporting structure comprises a recess extending in longitudinal direction of the supporting structure, wherein a passive shim bar can be easily inserted through the opening in the first end face to the first recess. Hence, the alignment of the passive shim bar is defined by the run of first recess in the supporting element. The supporting element, defining the run of the first recess, can be easily arranged on the primary coils. After arranging the supporting structure on the primary coil, shield coil can be arranged on the supporting structure. Hence, due to the simplified alignment of the supporting structure on the primary coil, providing a tray for the passive shim bar, manufacturing time of the gradient coil assembly and costs can be reduced.

All advantages and preferred embodiments of the above described supporting structure do also apply to the gradient coil assembly.

The invention further concerns to a method for manufacturing a gradient coil assembly for a Magnetic Resonance Imaging (MRI) system comprising the steps:
  Providing a cylindrical mandrel with an outer shell surface as an inner casing;
  Arranging primary coils on the outer shell surface of the cylindrical mandrel in a first layer;
  Arranging a supporting structure on the primary coils, wherein the supporting structure comprises at least a supporting element with a first end face and with at least a first recess comprising an opening in the first end face, wherein the first recess extends in a longitudinal direction of the supporting element forming a tray for receiving a passive shim bar;
  Arranging shield coils on the supporting structure in a second layer;
  Arranging an outer casing on the shield coils;
  Casting the annulus between the inner casing and the outer casing.

Primary coils preferably comprise x-, y- and z gradient coils. The primary coils are applied on the outer surface shell surface of a cylindrical mandrel, which is an inner casing, in a first layer. A supporting structure, usually comprising a plurality of supporting elements that are arranged on the primary coils. Each supporting element comprises a first end face and at least a first recess with an opening in the first end face, wherein the first recess extends in longitudinal direction of the supporting element forming a tray for receiving a passive shim bar. The longitudinal direction of the supporting element corresponds to the longitudinal direction of the cylindrical inner casing, which is also the z-direction of the gradient coil assembly, respectively of the MRI system. Hence, the alignment of the passive shim bar is defined by the run of first recess in the supporting element. The supporting element, defining the run of the first recess, can be easily arranged on the primary coils. After arranging the supporting structure on the primary coil, shield coils are arranged on the supporting structure in a second layer. An outer casing having a larger radii than the inner casing encloses the second layer. Preferably, a passive shim bar tool is inserted in the first recess. The passive shim bar tool is a space holder respectively dummy of a passive shim bar. The annulus between the inner casing and the outer casing is casted, preferably with resin. Since the dummy is inserted in the first recess, entering of casting material to the first recess can be avoided. Thus, a method for manufacturing a gradient coil assembly in one casting step is provided, saving manufacturing time and costs.

All advantages and preferred embodiments of the above described supporting structure and gradient coil assembly do also apply to the method for manufacturing the gradient coil assembly.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
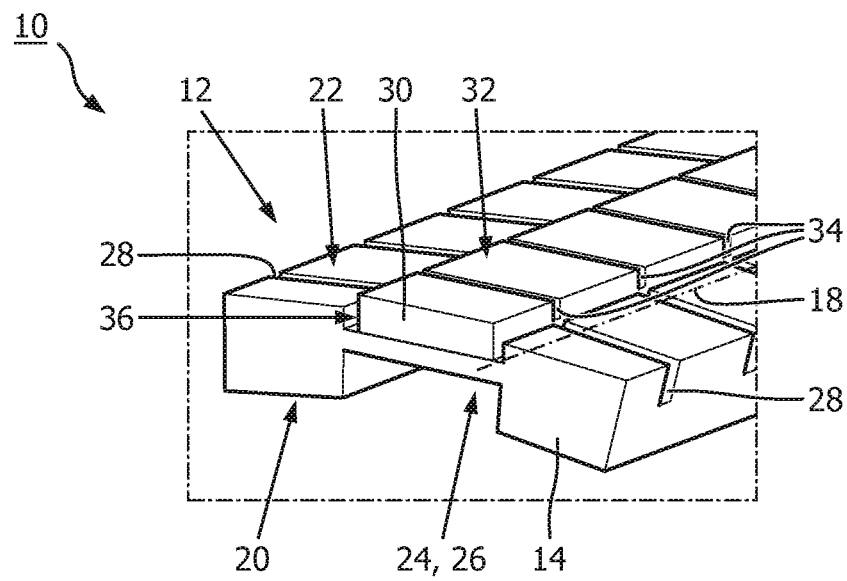
FIG. 1 shows a section of a supporting structure comprising a supporting element with a first recess in longitudinal direction of the supporting element, according to a preferred embodiment of the invention.

FIG. 1 shows a section of a supporting structure 10 for arranging between primary coils and shield coils of a gradient coil assembly according to a first embodiment. The supporting structure 10 comprises a supporting element 12, wherein the supporting element 12 comprises a first end face 14 and a second end face 16 (shown in FIG. 3). The first end face 14 is arranged spaced a part to the second end face 16 in longitudinal direction 18 of the supporting element 12. The supporting element 12 comprises an inner side 20 and an outer side 22, each being arranged in a direction parallel to the longitudinal direction 18 of the supporting element 12, wherein the outer side 22 is arranged spaced apart to the inner side 20. A first recess 24, comprising an opening 26 in the first end face 14, extends in longitudinal direction 18 of the supporting element 12, wherein the first recess 24 is arranged on the inner side 20 of the supporting element 12 forming a slot for receiving a passive shim bar. Thus, the supporting structure 10 comprises a first recess 24 extending in longitudinal direction 18 of the supporting element 12, wherein a passive shim bar can be easily inserted through the opening 26 in the first end face 14 to the first recess 24. Hence, the alignment of the passive shim bar is defined by the run of first recess 24 in the supporting element 12. The supporting element 12, defining the run of the first recess 24, can be easily arranged on primary coils of a gradient coil assembly. Thus, a supporting structure 10 is provided allowing a simplified alignment of passive shim bars with respect to the primary coils of a gradient coil assembly. Due to the supporting structure 10 the manufacturing time of the gradient coil assembly and costs can be reduced. The supporting structure 10 respectively the supporting element 12 can be easily and/or preferably manufactured by extrusion.

The outer side 22 comprises a plurality of first grooves 28, wherein the first grooves 28 are arranged at 90° with respect to the longitudinal direction 18 of the supporting element 12, which is a direction perpendicular to the longitudinal direction 18 of the supporting element 12. The first grooves 28 are arranged at least partially side by side to each other. Hence, a cooling channel (not shown) and/or a z-wire of a shield coil (not shown) can be easily positioned and guided in the first grooves 28 of the supporting element 12.

The supporting element 12 further comprises a distance setting element 30 positioned at least partially on the outer side 22 of the supporting element 12, wherein the distance setting element 30 comprises an outer surface 32, facing in the same direction as the outer side 22 of the supporting element 12. The outer surface 32 comprises a plurality of second grooves 34. Hence, a cooling channel and/or a z-wire of a shield coil can be inserted and guided in the second grooves 34. Preferably, a cooling channel or a z-wire of a shield coil is guided in the first grooves, wherein the other one of the cooling channel or the z-wire, which is guided in the first grooves, is guided in the second grooves of the distance setting element.

As shown, the outer side of the supporting element 12 comprises a second recess 36 in longitudinal direction 18 of the supporting element 12, and the distance setting element 30 is positioned in the second recess 36. Thus, the position of the distance setting element 30 can be secured since the distance setting element 30 is guided in the second recess 36 of the supporting element 12.

Figure 2:
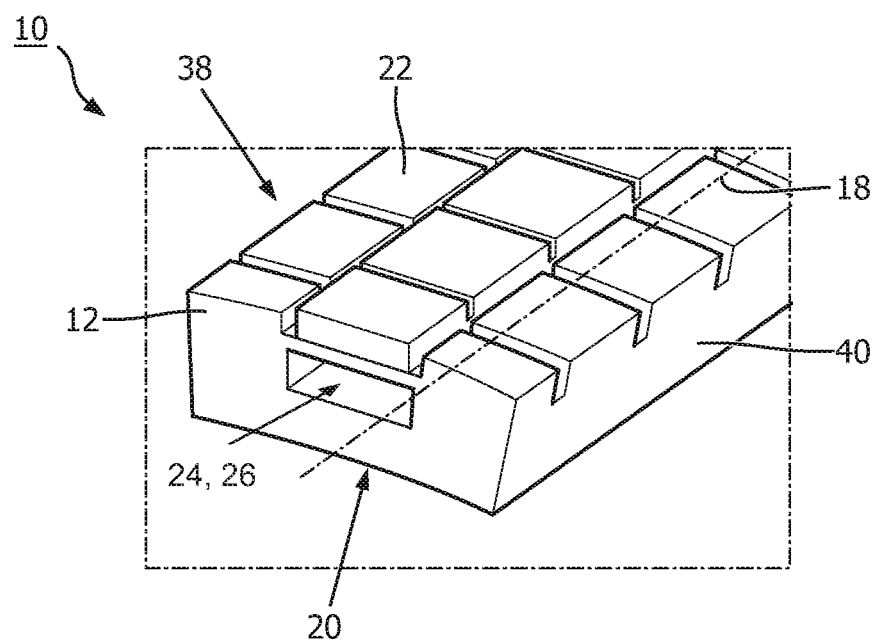
FIG. 2 shows a section of a supporting structure comprising a supporting element with a first recess in longitudinal direction of the supporting element, wherein the first recess is arranged between an inner side and an outer side of the supporting element, according to the preferred embodiment of the invention.

FIG. 2 shows the supporting structure 10 known from FIG. 1. The supporting structure 10 shown in FIG. 2 differs from the one shown in FIG. 1 in that the first recess 24 is arranged between the inner side 20 and the outer side 22. Thus, the first recess 24 is framed in a plane perpendicular to the longitudinal direction 18 of the supporting element 12. Hence, the framed first recess 24 between the inner side 20 and the outer side 22 can optimize the guiding for the passive shim bar, which is supposed to be inserted through the opening 26 to the first recess 24.

Furthermore, the supporting element 12 comprises a first side 38 connecting the inner side 20 and the outer side 22, and a second side 40 connecting the inner side 20 and the outer side 22, wherein the first side 38 is arranged spaced apart to the second side 40.

Figure 3:
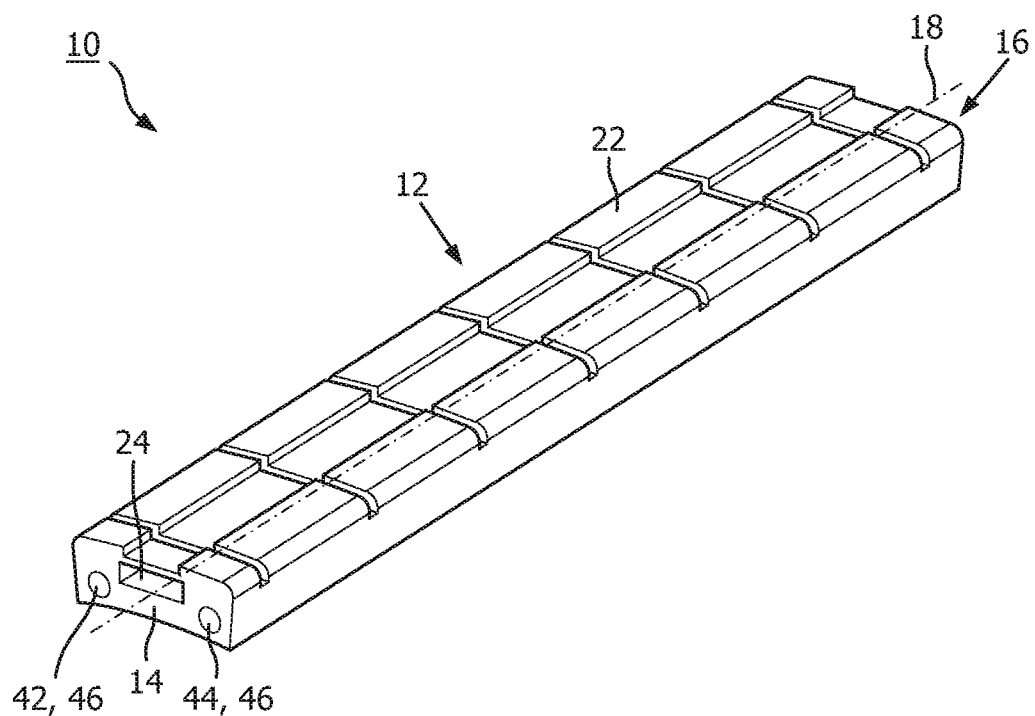
FIG. 3 shows a section of a supporting structure comprising a supporting element with channels in longitudinal direction of the supporting element, according to the preferred embodiment of the invention.

FIG. 3 shows the supporting structure 10, wherein the supporting element 12 comprises a first channel 42 and a second channel 44, each extending in longitudinal direction 18 of the supporting element 12 parallel to the first recess 24. Each channel 42, 44 comprises a first channel opening 46 in the first end face 14 and/or a second channel opening (not shown) in the second end face 16. Thus, a cooling channel can be guided through the first channel 42 and/or second channel 44. More preferably, a cooling unit can be connected to the first channel opening 46 and/or the second channel opening, wherein a cooling medium can be guided through the first channel 42 and/or second channel 44. Thus, a supporting structure 10 is provided, allowing a comfortable connection of a cooling unit respectively a comfortable arrangement of a cooling channel.

Preferably, the supporting element 12 comprises alumina ($Al_2O_3$). Thus, the supporting element 12 comprises a high specific heat conductivity. Heat from shielding coils of a gradient coil assembly, which are arranged on the supporting structure 10 and or in the first grooves 28, is transmitted through the supporting element 12 to the first cooling channel 42 and/or the second cooling channel 44 inside the supporting element 12 and cooled down. Hence, further cooling channels in the first grooves 28 and or second grooves 34 of the distance setting element 30 shown in FIG. 2 can be avoided. Thus, the structural height of the supporting structure 10 can be reduced.

Figure 4:
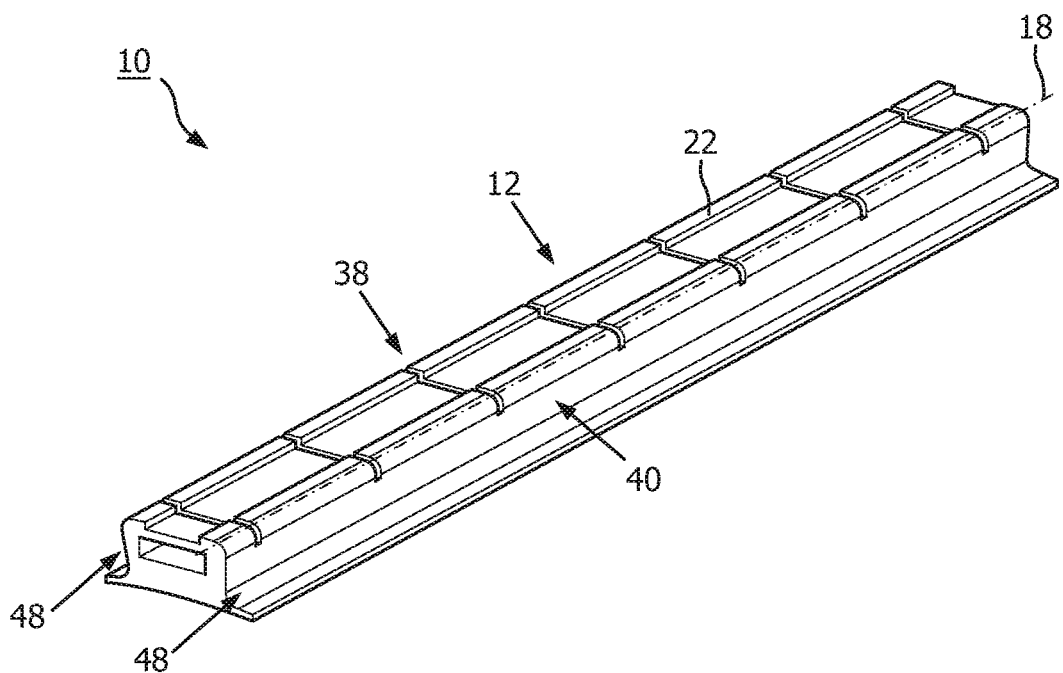
FIG. 4 shows a section of a supporting structure comprising a supporting element with third grooves, according to the preferred embodiment of the invention.

FIG. 4 shows the supporting structure 10 known from FIG. 2 wherein a third groove 48 extending in longitudinal direction 18 of the supporting element 12 is formed in a corner area of the outer side 22 and the first side 38 and in a corner area of the outer side 22 and the second side 40. Thus, the supporting element 12 comprises a guiding groove 48 for a cooling channel in longitudinal direction 18 of the supporting element 12.

Figure 5:
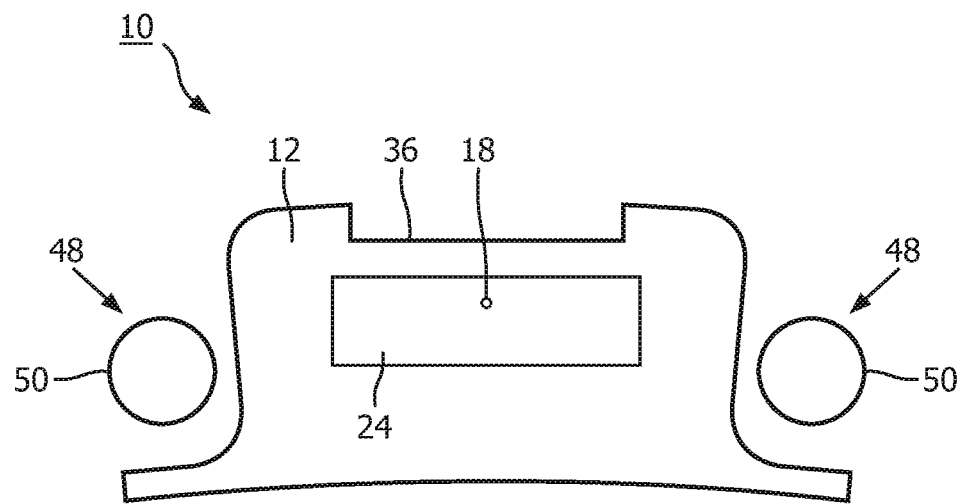
FIG. 5 shows a cross sectional view of the supporting structure in a plane perpendicular to the longitudinal direction of the supporting element, according to the preferred embodiment of the invention.

FIG. 5 shows a cross sectional view of the supporting structure 10 shown in FIG. 4 in a plane perpendicular to the longitudinal direction 18 of the supporting element 12. As shown, cooling channels 50 are arranged in the third grooves 48 of the supporting element 12.

Figure 6:
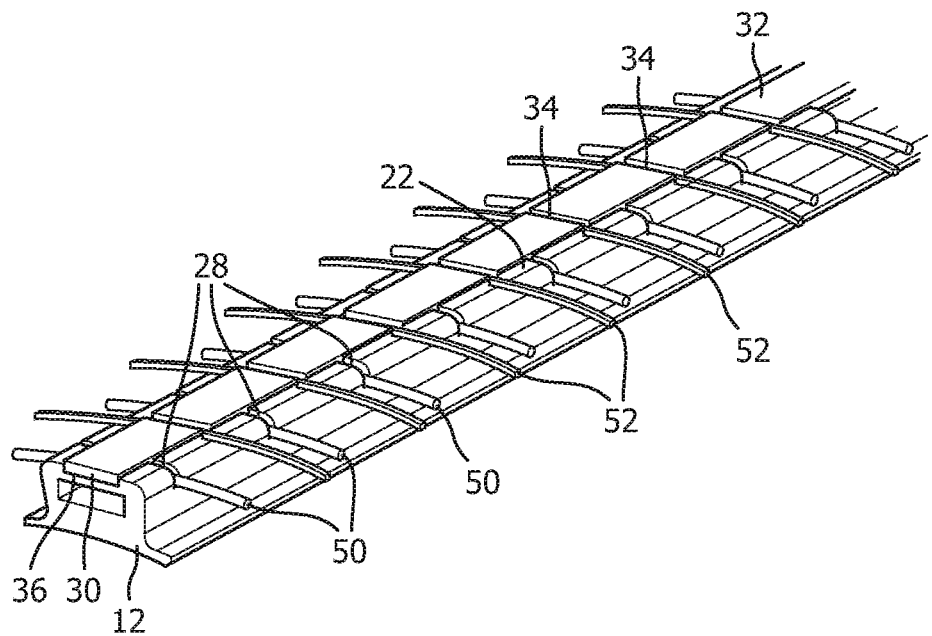
FIG. 6 shows a section of a supporting structure comprising a supporting element and a distance setting element, according to the preferred embodiment of the invention.

FIG. 6 shows the supporting structure 10 known from FIG. 4 comprising a supporting element 12 with first grooves 28 on the outer side 22 and a distance setting element 30 comprising second grooves 34 located on the outer surface 32, wherein the distance setting element 30 is arranged in the second recess 36 of the supporting element 12. A cooling channel 50 is inserted and guided in the first grooves 28 of the supporting element 12, and a z-wire 52 of a shield coil is inserted and guided in the second grooves 34.

Figure 7:
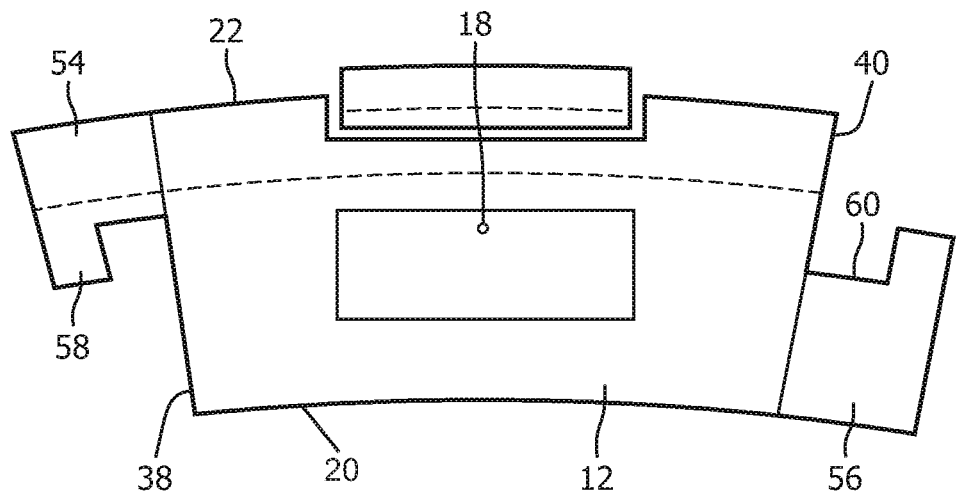
FIG. 7 shows a cross sectional view of the supporting structure in a plane perpendicular to the longitudinal direction of the supporting element, comprising interlocking structures, according to the preferred embodiment of the invention, FIG. 8 a gradient coil assembly comprising a supporting structure, according to the preferred embodiment of the invention, FIG. 9 a section of the gradient coil assembly comprising a supporting structure, according to the preferred embodiment of the invention, FIG. 10 a gradient coil assembly comprising a further supporting structure, according to the preferred embodiment of the invention.

FIG. 7 shows the supporting structure 10 in a cross sectional view in a direction perpendicular to the longitudinal direction 18 of the supporting element 12. The supporting element 12 comprises a ring segment shape in a plane perpendicular to the longitudinal direction 18 of the supporting element 12. Hence, the inner side 20 is formed as a first circular arc in a plane perpendicular to the longitudinal direction 18 of the supporting element 12 and the outer side 22 is formed in a second circular arc, wherein the radii of the second circular arc is larger than the one of the first circular arc. The first side 38 and the second side 40 are directed in radial direction. Thus, the supporting element 12 can be easily applied on primary coils around a cylindrical mandrel.

The first side 38 comprises a first interlocking structure 54, and the second side 40 comprises a second interlocking structure 56, wherein the first interlocking structure 54 corresponds to the second interlocking structure 56. Thus, a first supporting element 12 can be connected to a second one. Hence, the structural strength of the supporting structure 10 comprising a plurality of supporting elements 12 can be increased and vibrations of a gradient coil assembly during operation can be reduced. The first interlocking structure 54 and the corresponding second interlocking structure 56 is not limited to a specific design. Preferably, the first interlocking structure 54 is a protrusion 58 formed on the first side 38 of the supporting element 12 and the second interlocking structure is an interlocking recess 60 formed on the second side 40 of the supporting element 12.

Figure 8:
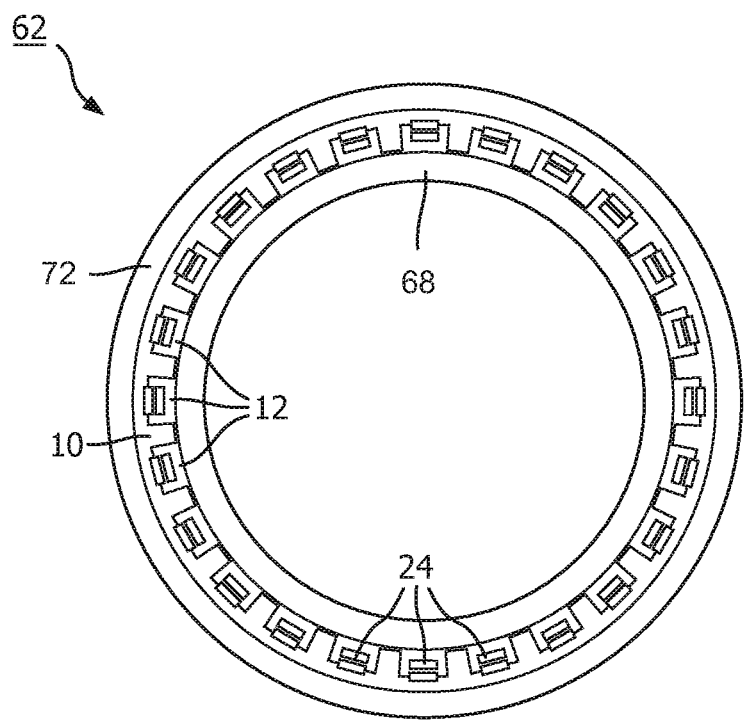

FIG. 8 shows a cross sectional view of a cylindrically designed gradient coil assembly 62 for use in a Magnetic Resonance Imaging (MRI) system, comprising primary coils 68, shield coils 72 and a supporting structure 10 being arranged between the primary coils 68 and the shield coils 72. The supporting structure 10 comprises a plurality of supporting elements 12, which are known from FIGS. 4 and 6. The supporting elements 12 are arranged in peripheral direction around the cylindrically arranged primary coils 68, wherein the first recess 24 of each supporting element 12, and therefore the longitudinal direction of each supporting element 12, is directed in longitudinal direction of the cylindrically designed gradient coil assembly 62.

Figure 9:
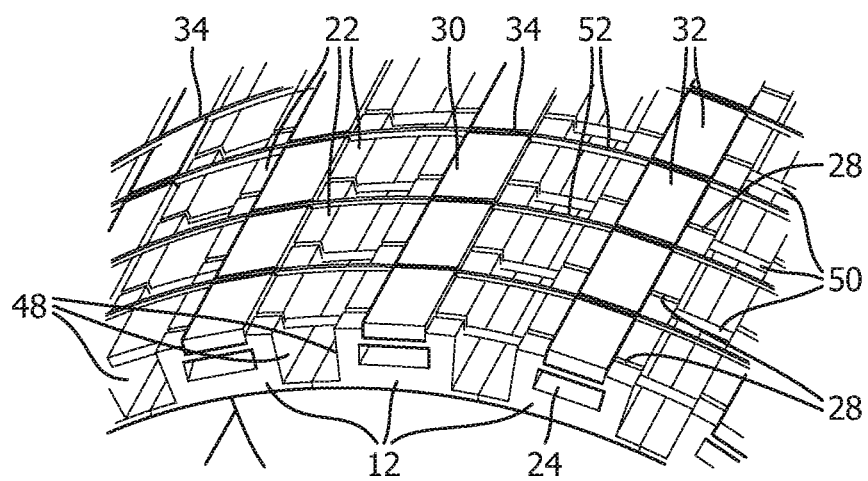

FIG. 9 shows a detailed view of the cylindrically arranged supporting elements 12 known from FIG. 8. The supporting elements are arranged side by side according to their longitudinal sides, wherein each supporting element comprises a first recess 24 for receiving a passive shim bar. Each supporting element 12 comprises third grooves 48 for guiding a cooling channel (not shown) in longitudinal direction of the supporting elements 12. Furthermore, each supporting element 12 comprises first grooves 28 on the outer side 22 and a distance setting element 30 comprising second grooves 34 located on the outer surface 32. A cooling channel 50 is inserted and guided in the first grooves 28 of the supporting element 12, and a z-wire 52 of a shield coil is inserted and guided in the second grooves 34.

Figure 10:
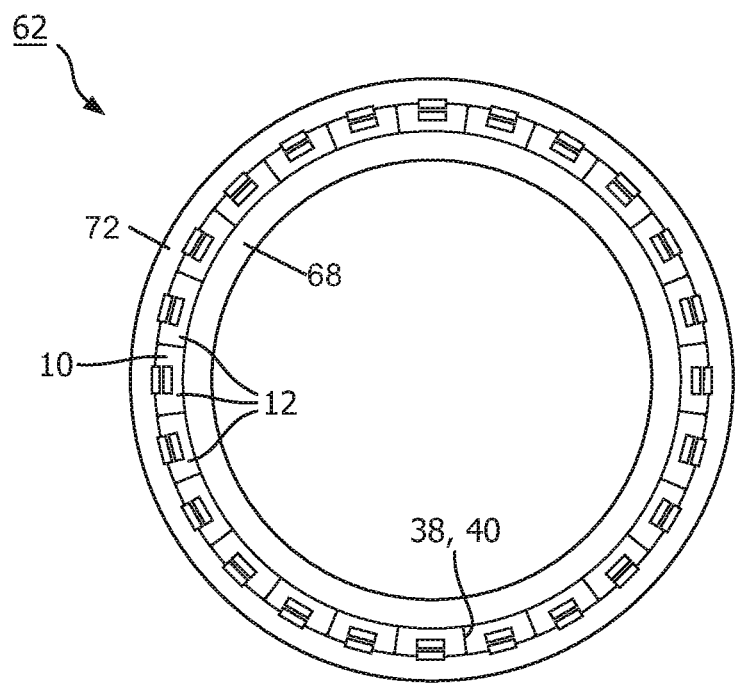

FIG. 10 shows a cross sectional view of the cylindrically designed gradient coil assembly 62 comprising a supporting structure 10 with a plurality of supporting elements 12. The gradient coil assembly 62 differs from the one shown in FIG. 8 in that the supporting elements 12 have no third grooves. Thus, the supporting elements are arranged side by side in peripheral direction around the cylindrically arranged primary coils 68, wherein the first side 38 of a first supporting element 12 is in contact with the second side 40 of a second supporting element 12.

Figure 11:
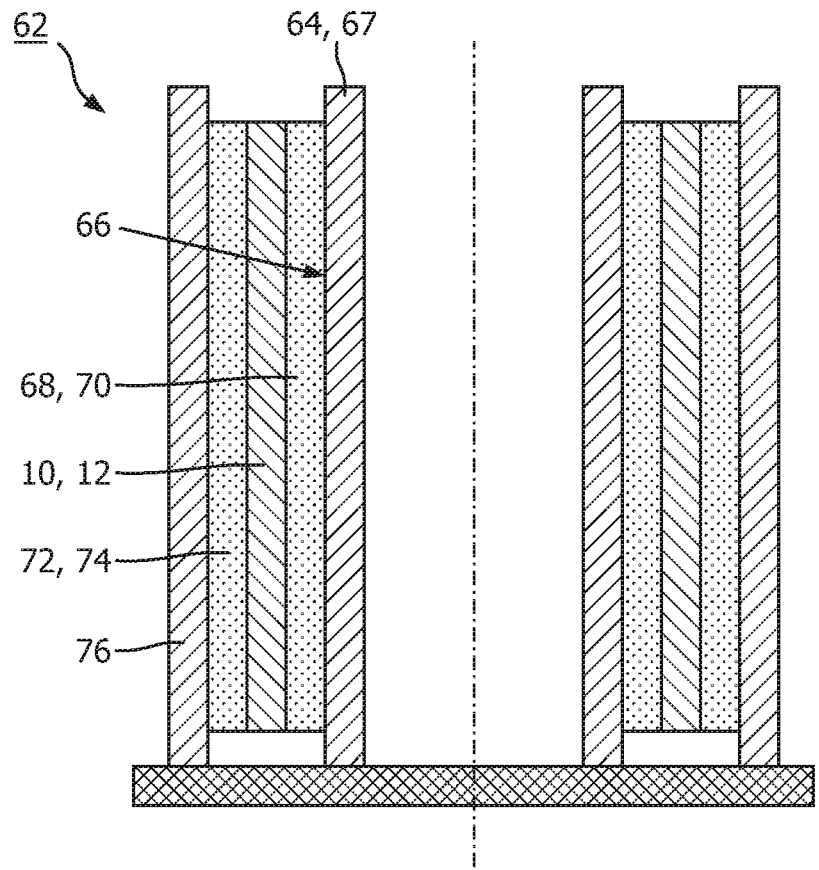
FIG. 11 shows a manufacturing method of the gradient coil assembly, according to a preferred embodiment of the invention.

FIG. 11 shows a manufacturing step for manufacturing a gradient coil assembly 62. A cylindrical mandrel 64 having an outer shell surface 66 is provided as an inner casing 67. A primary coil 68 is arranged on the outer shell surface 66 of the inner casing 67 in a first layer 70. The supporting structure 10, comprising a plurality of supporting elements 12, is arranged on the primary coil 68. Each supporting element 12 comprises at least a first recess in longitudinal direction of the supporting element 12 forming a tray for receiving a passive shim bar. The longitudinal direction of the supporting element 12 corresponds to the longitudinal direction of the cylindrical mandrel 64, which is also the z-direction of the gradient coil assembly 62. Hence, the alignment of the passive shim bar is defined by the run of first recess in the supporting element 12. The supporting elements 12, defining the run of the first recess, are arranged in peripheral direction on the cylindrically arranged primary coil 68. After arranging the supporting structure 10 on the primary coil 68, a shield coil 72 is arranged on the supporting structure 10 in a second layer 74. A cylindrically formed outer casing 76 encloses the second layer 74. A passive shim bar tool is inserted in the first recess. The passive shim bar tool is a space holder, respectively dummy of a passive shim bar. The annulus between the inner casing 67 and the outer casing 76 is casted, preferably with resin. Since the dummy is inserted in the first recess, entering of casting material to the first recess can be avoided. Thus, a method for manufacturing a gradient coil assembly in one casting step is provided, saving manufacturing time and costs.

Figure 12:
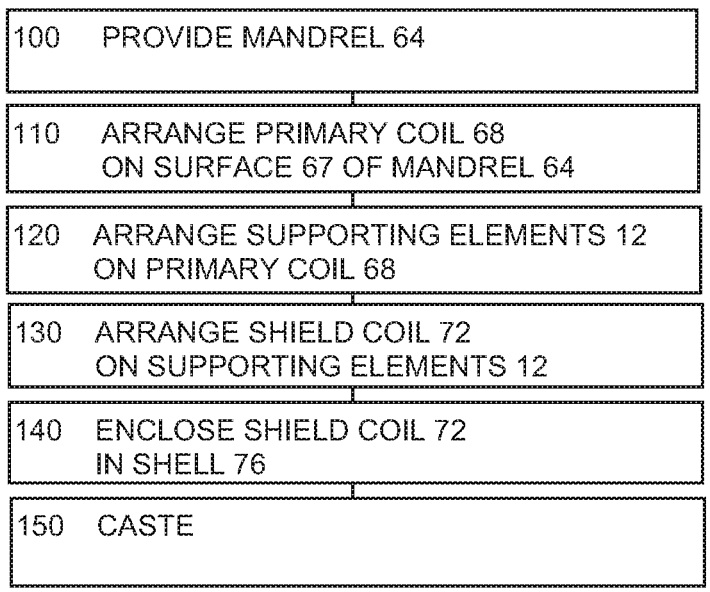
FIG. 12 shows a flow chart of a manufacturing method, according to the preferred embodiment of the invention.

FIG. 12 shows flow chart of a method for manufacturing a gradient coil assembly.

In a first step 100, a cylindrical mandrel 64 with an outer shell surface 67 as an inner casing is provided. The cylindrical mandrel defines the inner diameter of the gradient coil assembly.

In a second step 110, a primary coil 68 is arranged on the outer shell surface 67 of the cylindrical mandrel 64 in a first layer.

According to a third step 120, the supporting structure 10 comprising a plurality of supporting elements 12, each having at least a first recess 24 for receiving a passive shim bar, is arranged in peripheral direction on the primary coil 68. The supporting element defining the run of the first recess for receiving the passive shim bar can be comfortably and accurately adjusted on the primary coil. Thus, manufacturing time and costs for adjusting the supporting element, respectively the first recess for a passive shim bar, can be reduced.

In a further step 130, a shield coil 72 is arranged on the supporting structure 10. Due to the arrangement of the shield coil on the supporting structure, preferably by a z-wire of the shield coil, the supporting structure can be easily fixed to the passive coil.

In a further step 140, a cylindrically formed outer casing 76 encloses the shield coil. Thus, an annulus between the inner casing and the outer casing is provided, wherein the primary coil 68, the supporting structure 10 and the shield coil 72 are arranged in the annulus.

In a further step 150, the annulus between the inner casing 67 and the outer casing 76 is casted, preferably with resin. Thus, a method is provided, wherein the gradient coil can be manufactured by one step casting. For avoiding that casting material enters the first recess during casting the annulus, a dummy in form of a passive shim bar tool is inserted in the first recess for the casting step.

LIST OF REFERENCE NUMERALS

10 Supporting structure
12 Supporting element
14 First end face
16 Second end face
18 Longitudinal direction of supporting element
20 Inner side
22 Outer side
24 First recess
26 Opening in first end face
28 First grooves
30 Distance setting element
32 Outer surface
34 Second grooves
36 Second recess
38 First side
40 Second side
42 First channel
44 Second channel
46 Channel opening
48 Third grooves
50 Cooling Channel
52 Z-wire of shield coil
54 First interlocking structure
56 Second interlocking structure
58 Protrusion
60 Interlocking recess
62 Gradient coil assembly
64 Mandrel
66 Outer shell surface
67 Inner casing
68 Primary coil
70 First layer
72 Shield coil
74 Second layer
76 Outer casing
100 Providing mandrel as inner casing
110 Arranging primary coil on inner casing
120 Arranging supporting structure on primary coil
130 Arranging shield coil on supporting structure
140 Enclosing shield coil by outer casing
150 Casting annulus between inner casing and outer casing

The invention claimed is:

1. A gradient coil assembly for use in a Magnetic Resonance Imaging (MRI) system, comprising
primary coils,
shield coils and
a plurality of supporting elements arranged between the primary coils and the shield coils, each supporting element having an inner side facing the primary coil, an outer side facing the shield coil and an end face, the inner and outer sides being arranged in a direction parallel to a longitudinal direction of the supporting element, a recess being defined in the inner side extending in the longitudinal direction of the supporting element forming a passive shim bar receiving tray between the supporting element inner side and the primary coil, the end face defining an opening to provide access to the recess.

2. A magnetic resonance imaging system, comprising a gradient coil assembly according to claim 1.

3. A gradient coil for use in a magnetic resonance imaging (MRI) system comprising:
primary coils,
shield coils,
a supporting structure being arranged between the primary coils and the shield coils, wherein the supporting structure comprises at least a supporting element comprising a first end face and at least a first recess with an opening in the first end face, wherein the first recess extends in a longitudinal direction of the supporting element forming a tray configured to receive a passive shim bar,
wherein the supporting element comprises an inner side and an outer side each being arranged in a direction parallel to the longitudinal direction of the supporting element, and the outer side is arranged spaced apart to the inner side, wherein
the first recess is arranged on the inner side or the first recess is arranged between the inner side and the outer side, and
a plurality of grooves defined in the outer side.

4. The gradient coil assembly according to claim 3, wherein the longitudinal direction of each first groove is arranged in an angle between 80° and 90° with respect to the longitudinal direction of the supporting element.

5. A magnetic resonance imaging system, comprising a gradient coil assembly according to claim 3.

6. A gradient coil assembly for use in a magnetic resonance imaging (MRI) system comprising:
primary coils,
shield coils,
a supporting structure being arranged between the primary coils and the shield coils, wherein the supporting structure comprises at least a supporting element comprising a first end face and at least a first recess with an opening in the first end face, wherein the first recess extends in a longitudinal direction of the supporting element forming a tray configured to receive a passive shim bar,
wherein the supporting element comprises an inner side and an outer side each being arranged in a direction parallel to the longitudinal direction of the supporting element, and the outer side is arranged spaced apart to the inner side, wherein
the first recess is arranged on the inner side or
the first recess is arranged between the inner side and the outer side, and
a distance setting element positionable at least partially on the outer side of the supporting element, wherein the distance setting element comprises an outer surface, facing in the same direction as the outer side of the supporting element, and the outer surface comprises a plurality of grooves.

7. The gradient coil assembly according to claim 6, wherein the outer side of the supporting element defines a second recess in the longitudinal direction of the supporting element, and wherein the distance setting element is positionable in the second recess.

8. The gradient coil assembly according to claim 6, wherein the longitudinal direction of the grooves is arranged in an angle between 80° and 90° with respect to the longitudinal direction of the supporting element.

9. The gradient coil assembly according to claim 6, wherein the supporting element further comprises a first side connecting the inner side and the outer side, and a second side connecting the inner side and the outer side, wherein the first side is arranged spaced apart to the second side.

10. The gradient coil assembly according to claim 6, wherein the supporting element comprises at least a channel extending in longitudinal direction of the supporting element.

11. A magnetic resonance imaging system, comprising a gradient coil assembly according to claim 6.

12. A gradient coil assembly for use in a magnetic resonance imaging (MRI) system comprising:
primary coils,
shield coils,
a supporting structure being arranged between the primary coils and the shield coils, wherein the supporting structure comprises at least a supporting element comprising a first end face and at least a first recess with an opening in the first end face, wherein the first recess extends in a longitudinal direction of the supporting element forming a tray configured to receive a passive shim bar,
wherein the supporting element comprises an inner side and an outer side each being arranged in a direction parallel to the longitudinal direction of the supporting element, and the outer side is arranged spaced apart to the inner side,
wherein the supporting element further comprises a first side connecting the inner side and the outer side, and a second side connecting the inner side and the outer side, wherein the first side is arranged spaced apart to the second side, wherein:
the first recess is arranged on the inner side or
the first recess is arranged between the inner side and the outer side, and
a groove extending in the longitudinal direction of the supporting element is defined:
in a corner area of the outer side and the first side and/or
in the corner area of the outer side and the second side.

13. A magnetic resonance imaging system, comprising a gradient coil assembly according to claim 12.

14. A gradient coil assembly for use in a magnetic resonance imaging (MRI) system comprising:
primary coils,
shield coils,
a supporting structure being arranged between the primary coils and the shield coils, wherein the supporting structure comprises at least a supporting element comprising a first end face and at least a first recess with an opening in the first end face, wherein the first recess extends in a longitudinal direction of the supporting element forming a tray configured to receive a passive shim bar,
wherein the supporting element comprises an inner side and an outer side each being arranged in a direction parallel to the longitudinal direction of the supporting element, and the outer side is arranged spaced apart to the inner side, wherein
the first recess is arranged on the inner side or
the first recess is arranged between the inner side and the outer side, and
wherein the supporting element further comprises a first side connecting the inner side and the outer side, and a second side connecting the inner side and the outer side, wherein the first side is arranged spaced apart to the second side, and
wherein the first side comprises a first interlocking structure, and the second side comprises a second interlocking structure, wherein the first interlocking structure and the second interlocking structure are configured to interlock the supporting elements with each other.

15. The gradient coil assembly according to claim 14, wherein the supporting structure comprises concrete and/or glass and/or ceramics.

16. A magnetic resonance imaging system, comprising a gradient coil assembly according to claim 14.

17. A method for manufacturing a gradient coil assembly for a magnetic resonance imaging system comprising:
providing a cylindrical mandrel with an outer shell surface as an inner casing;
arranging primary coils on the outer shell surface of the cylindrical mandrel in a first layer;
arranging a supporting structure on the primary coils, wherein the supporting structure comprises at least a supporting element with a first end face and a second end face, wherein the second end face is arranged spaced apart to the first end face in longitudinal direction of the supporting element, and with at least a first recess comprising an opening in the first end face, wherein the first recess extends in longitudinal direction of the supporting element forming a tray for receiving a passive shim bar;

arranging shield coils on the supporting structure in a second layer;

arranging an outer casing on the shield coils;

casting between the inner casing and the outer casing.

* * * * *